United States Patent [19]

Daiko et al.

[11] Patent Number: 4,697,964

[45] Date of Patent: Oct. 6, 1987

[54] BORING MACHINE

[75] Inventors: Yoichi Daiko, Sagamihara; Masami Masuda; Takao Terabayashi, both of Yokohama, all of Japan

[73] Assignee: Hitachi, Ltd., Tokyo, Japan

[21] Appl. No.: 758,033

[22] Filed: Jul. 23, 1985

[30] Foreign Application Priority Data

Jul. 24, 1984 [JP] Japan .................................. 59-152063

[51] Int. Cl.$^4$ .............................................. B23B 39/00
[52] U.S. Cl. .......................................... 408/6; 408/11; 408/704
[58] Field of Search ......................... 408/5, 6, 11, 704; 318/632

[56] References Cited

U.S. PATENT DOCUMENTS

| | | | |
|---|---|---|---|
| 3,612,840 | 10/1971 | Stobbe | 318/632 X |
| 3,754,178 | 8/1973 | Dormehl | 318/632 X |
| 3,942,087 | 3/1976 | Maisch | 318/632 X |
| 4,342,528 | 8/1982 | Nozu | 408/6 |
| 4,346,444 | 8/1982 | Schneider | 408/11 X |
| 4,441,059 | 4/1984 | Watanabe | 408/11 X |
| 4,442,389 | 4/1984 | Sawada | 318/632 X |
| 4,442,493 | 4/1984 | Wakai | 408/6 X |

*Primary Examiner*—John Sipos
*Attorney, Agent, or Firm*—Antonelli, Terry & Wands

[57] ABSTRACT

This invention is directed to a boring machine provided with a spindle supported rotatably in a spindle housing, a driving means for rotating the spindle, and a spindle feed mechanism supporting the spindle housing so that the spindle housing can be moved up and down. This boring machine includes a means for detecting the level of axial displacement of the spindle in boring motion with the detecting means not contacting the spindle, and a comparator for comparing the level of the actual axial displacement of the spindle or the thrust force applied thereto and corresponding to this displacement with a predetermined threshold level of axial displacement or a threshold level of thrust force. The spindle feed mechanism is controlled in response to the output from the comparator.

13 Claims, 13 Drawing Figures

BORING MACHINE

BACKGROUND OF THE INVENTION

This invention relates to a boring machine, and more particularly to a minute and deep bore-making boring machine suitable for making minute, deep bores in a printed wiring board.

First, a conventional minute and deep bore-making boring machine used to make a minute, deep bore in a printed wiring board will be described.

FIG. 1 is a partially sectioned view of an example of a conventional minute and deep bore-making boring machine, and FIG. 2 a sectional view of a principal portion of another example of a conventional machine of this kind.

The boring machine of FIG. 1 has a compressed air-driven type spindle supported on air bearings. Referring to FIG. 1, reference numeral 1 denotes a spindle holding a drill 3 and supported rotatably in a spindle housing, 4 a turbine constituting a driving means for rotating (60,000–80,000 r.p.m) the spindle 1, and 8a, 8b, 8c air bearings supporting the spindle 1. These parts constitute a boring unit 20. Reference numeral 5 denotes a spindle feed mechanism provided integrally with the spindle housing 2 and supporting the same so that the spindle housing can be moved up and down. This spindle feed mechanism 5 is provided with a feed motor 5a for moving the former up and down. Reference numeral 6 denotes a workpiece to be bored by the drill 3, the workpiece being fixed by a workpiece-clamping mechanism 7.

FIG. 2 shows a principal portion, i.e. a boring unit of another boring machine, which has a spindle 1A driven by a high-frequency motor and supported on air bearings 8a, 8b, 8c. The parts shown in FIG. 2 and designated by the same reference numerals as in FIG. 1 are identical with those of such reference numerals in FIG. 1. Reference numeral 9 denotes a stator of the high-frequency motor in the spindle housing 2A, and 10 a rotor fitted in the spindle 1A.

The conventional boring machine of the above-described construction is not provided with a means for detecting the thrust force applied to the drill 3 when boring the workpiece 6 with the drill 3. Consequently, even when the thrust force increases while forcing to such an extent that the workpiece 6 and drill 3 are affected adversely thereby, boring contiues. Thus, feed control is impossible in this boring machine.

Therefore, when the thrust force mentioned above increases excessively, chapping of the inner surface of the bore as well as cracks and large burrs at the outlet of the bore readily occur. Hence, a high quality bore cannot be made, and, moreover, there is the possibility that the drill 3 will be broken.

There are some examples of a conventional boring machine in which the drill is controlled in accordance with a signal detected continuously during boring and representative of the torque in the direction of rotation of the drill, such examples being disclosed in, for instance, Japanese Patent Laid-Open Nos. 50079/1976, 93484/1976, 3776/1977 and 23792/1977. In all of these boring machines, torque in the direction of rotation the drill is measured so as to detect the cutting force applied by the drill. Therefore, the construction of these boring machines is complicated, and the boring units thereof cannot possibly be applied to a boring machine like the boring machine of the present invention which can be operated at a high speed of 60,000–80,000 r.p.m.

The conventional minute and deep bore-making boring machine is provided with no suitable detecting means; incapable as mentioned previously of controlling the cutting operation which is important for a boring machine; incapable of making a high-quality bore easily; and would cause the breakage of the drill during a bore-making operation.

SUMMARY OF THE INVENTION

The present invention is directed to a boring machine in which the above-mentioned problems in the prior art machines of this kind have been solved. The boring machine according to the present invention is capable of detecting during a boring operation the axial displacement of the drill-holding spindle or the thrust force occurring in the spindle being axially displaced, with the detecting means not being kept in contact with the spindle in high-speed rotary motion. Namely, the present invention enables the obtainment of a boring machine of a comparatively simple construction, which is capable of controlling a cutting operation which is difficult to control in a conventional boring machine; and making a minute, deep bore of a high quality without breaking the drill.

DESCRIPTION OF THE PREFERRED EMBODIMENTS:

Before describing the embodiments, the basic matters concerning the present invention will be described with reference to FIG. 3.

Figure 1:
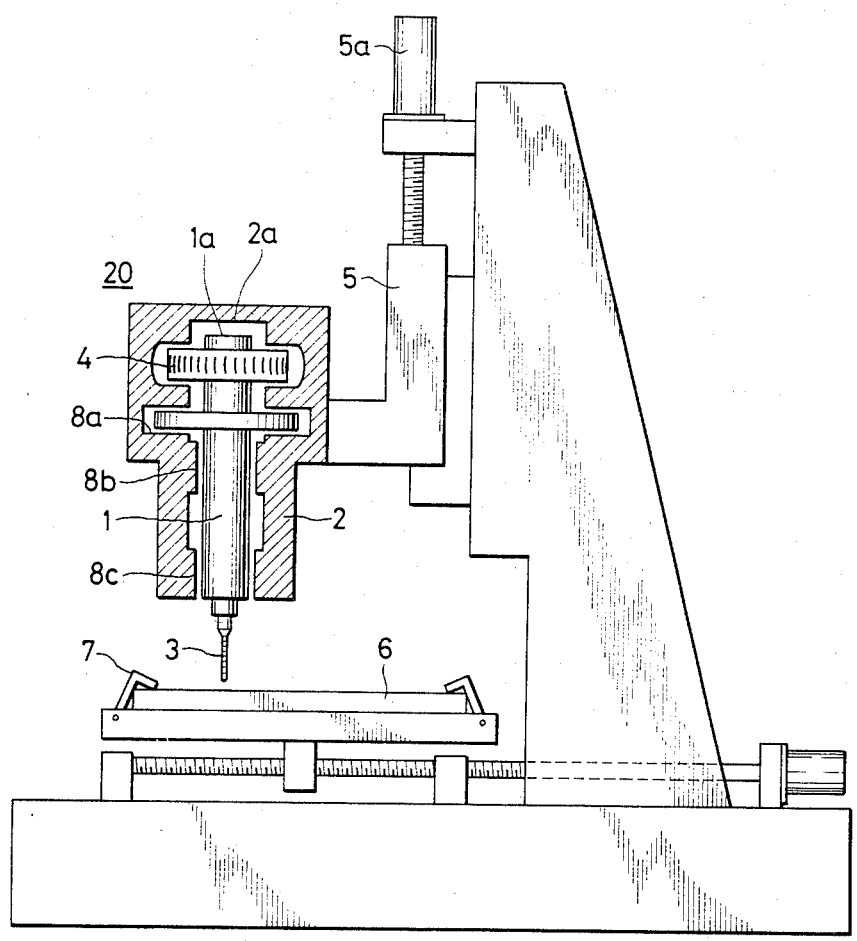
FIG. 1 is a partially-sectioned schematic diagram of an example of a conventional minute and deep bore-making boring machine.
Figure 3:
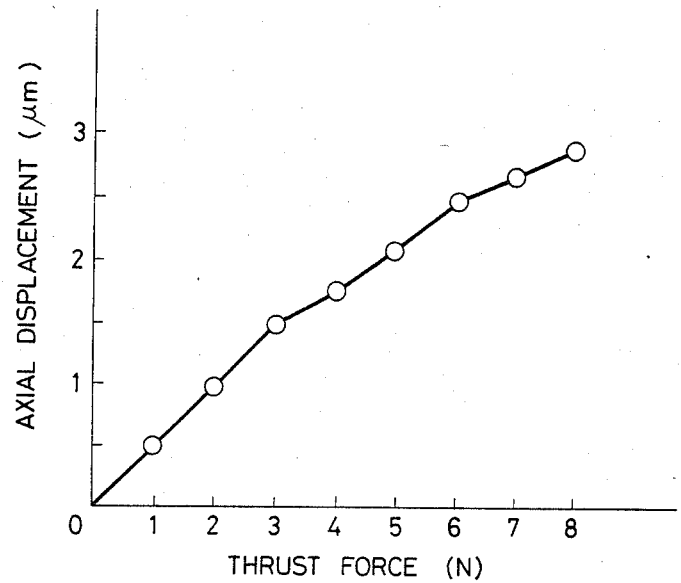
FIG. 3 is a graph showing the relation between the thrust force applied to a spindle during a boring operation of the boring machine of FIG. 1 and the axial displacement of the spindle.

FIG. 3 is a graph showing the relation between the thrust force applied to a spindle during a boring operation of a boring machine of FIG. 1 and the axial displacement of the spindle.

The present inventors determined the axial displacement of the spindle 1 in the boring machine of FIG. 1, which occurred when the thrust force (measured with a dynamometer) was applied to the spindle 1, by measuring the distance between a portion 1a thereof and a portion 2a of the spindle housing with a non-contacting micro-displacement gauge. The results are shown in FIG. 3. The inventors discovered the fact that the axial displacement of the spindle is substantially proportional to the thrust force applied thereto as shown in FIG. 3. The level of the thrust force applied to the spindle during an operation for making a minute, deep bore in a printed wiring board is 5~7N, and the thrust force in this range can be detected satisfactorily. Moreover, the above-mentioned proportional relation holds good in this range. It was ascertained that this proportional relation holds good in various types of boring machines including not only the boring machine of FIG. 1 but also a boring machine provided with the boring unit of FIG. 2 as a principal part thereof, and a boring machine (not shown) having a high-frequency-driven type spindle supported on ball bearings.

The present invention has been developed on the basis of these basic concepts. The boring machine according to the present invention is capable of carrying out a stable boring operation by a method of detecting the axial displacement of the spindle by a non-contacting micro-displacement gauge, determining the thrust force, which is applied to the spindle, by a converter adapted to convert the axial displacement into the thrust force, or an amplifying converter (which will hereinafter be referred to generally as "converter") adapted to amplify the axial displacement as necessary and thereafter convert the resultant axial displacement into thrust force, and interrupting the boring operation when the thrust force has exceeded a predetermined threshold level, and carring out a back feed operation. The back feed operation referred to above means an operation for interrupting the feeding of the drill and then moving the drill back until the drill has been positioned outside the bore being made, to then move the drill forward to the workpiece and bore the same again.

The present invention will now be described with reference to its embodiments.

Figure 4:
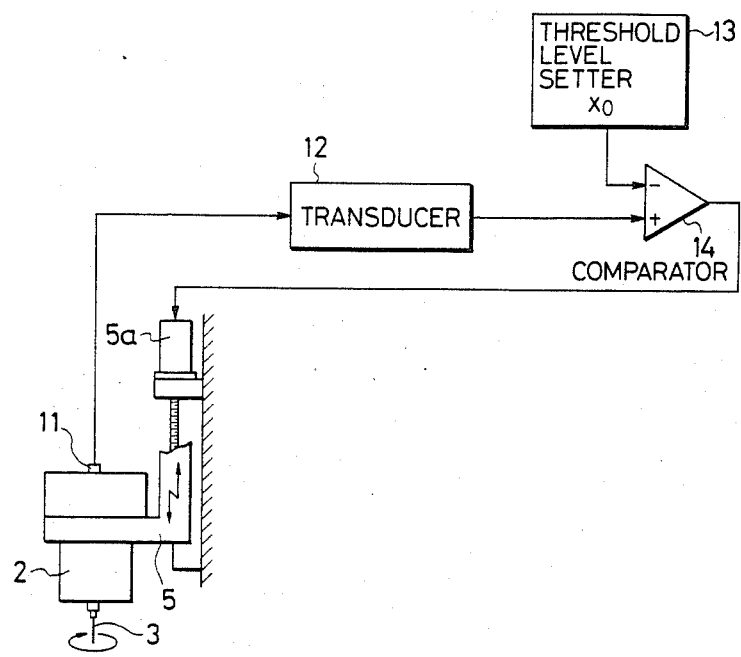
FIG. 4 is a schematic diagram of a first embodiment of the boring machine according to the present invention.
Figure 5:
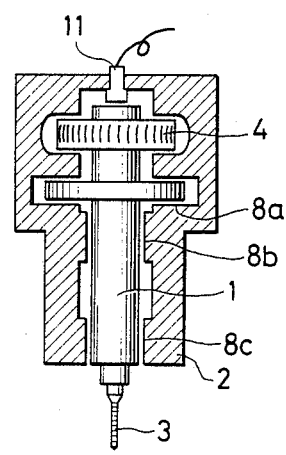
FIG. 5 is a sectional view showing the details of the interior of a spindle housing in the embodiment of FIG. 4.
Figure 6:
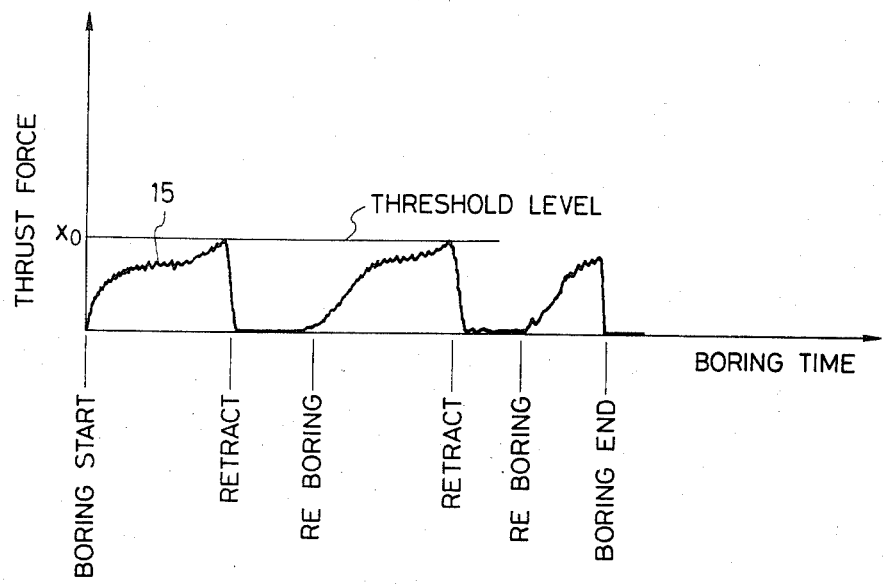
FIG. 6 is a graph showing the relation between the boring time and thrust force in the embodiment of FIG. 4.

FIG. 4 is a schematic diagram of an embodiment of the boring machine according to the present invention, FIG. 5 a sectional view showing the details of the interior of a spindle housing of a boring unit which constitutes a principal portion of the embodiment of FIG. 4, and FIG. 6 a graph showing the relation between the boring time and thrust force in the boring machine of FIG. 4.

The parts of what are shown in FIGS. 4 and 5 which are designated by the same reference numerals as in FIG. 1 are identical with the parts of such reference numerals in FIG. 1.

The workpiece and a fixing means therefor are identical with those shown in FIG. 1, and the illustration thereof will be omitted. Reference numeral 11 denotes a non-contacting micro-displacement gauge), which is provided on a spindle housing 2 so as to be opposed to the upper end of a spindle 1, and which is capable of detecting axial displacement, which occurs during a boring operation of a drill 3, of the spindle 1 with this gauge not contacting the spindle 1, 12 a transducer consisting of a known function generator or a computing element and adapted to receive a displacement signal from the non-contacting micro-displacement gauge 11, amplify this signal, and thereafter convert the resultant signal into thrust force having the relation, which is shown in, for example, FIG. 3, with respect to the same input displacement signal, 13 a threshold level setter for use in setting in advance a threshold level (which is obtained by determining experimentally in advance the thrust force which enables a bore of acceptable quality to be made and which does not cause the drill 3 to be broken, and multiplying the resultant level of thrust force by a suitable safety factor) of the thrust force applied to the drill, and 14 a comparator adapted to compare a signal of thrust force from the transducer 12 with a signal of threshold level from the setter 13, and capable of sending when the level of a signal of actual thrust force is higher than the threshold level a signal for carrying out a back feed operation to a motor 5a for lifting and lowering the spindle in a spindle feed mechanism 5.

The operation of the boring machine constructed as mentioned above will now be described.

A workpiece 6 to be bored is fixed (refer to FIG. 1) by a workpiece-fixing means 7. A threshold level $x1_0$ of axial force is set in the setter 13 shown in FIG. 4.

When the boring machine is then actuated, compressed air from a compressed air source (not shown) is supplied to a turbine 4 and air bearings 8a, 8b, 8c, and the spindle 1 is rotated at a predetermined rotary speed (r.p.m.). The motor 5a is then rotated to cause the spindle feed mechanism 5 to move down at a predetermined speed. When the free end of the drill 3 engages the workpiece 6, boring the workpiece 6 begins. The axial displacement of the spindle 1 during this boring operation is detected by the non-contacting micro-displacement gauge 11 shown in FIG. 5, and a signal of this displacement is converted into an output signal 15 (refer to FIG. 6) of thrust force, which is input into the comparator 14. In this comparator 14, the signal 15 of thrust force and the threshold level $x_o$ are compared. When the level of the signal 15 has exceeded the threshold level $x_o'$ a signal for carrying out a back feed operation is outputted to the motor 5a. As a result, the spindle feed mechanism 5 stops being moved down, to interrupt the feeding of the spindle. The spindle feed mechanism 5 then moves up, and the drill 3 is moved back to the outside of the bore being made, and the spindle feed mechanism 5 is moved down again to resume boring. These boring actions are repeated. When a desired bore has been made in the workpiece 6, boring is stopped, and the operation of the boring machine finishes.

Another embodiment will now be described.

Figure 7:
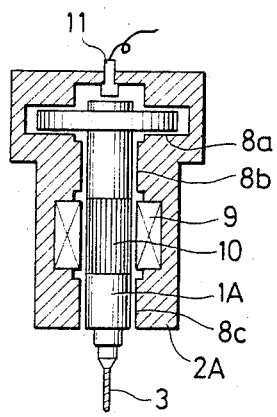
FIGS. 7 and 8 are sectional views of different examples of a principal portions, i.e. a boring unit of the present invention.
Figure 8:
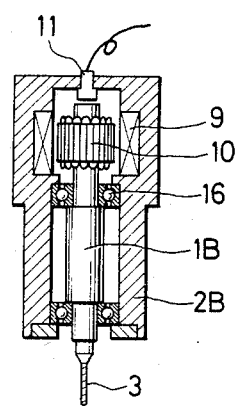

FIGS. 7 and 8 are sectional views showing the details of the interior of spindle housings which constitute the principal portions of different embodiments of the boring machine according to the present invention.

Figure 2:
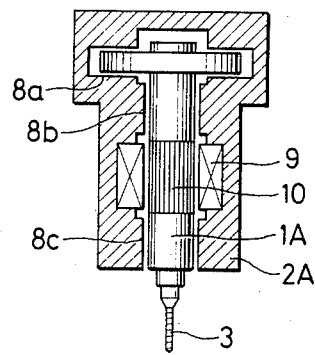
FIG. 2 is a sectional view of a principal portion of another example of a conventional boring machine.

FIG. 7 shows a boring unit, which constitutes a principal portion of a boring machine according to the present invention, and which is an improvement of the boring unit shown in FIG. 2. In the boring unit of FIG. 7, a non-contacting micro-displacement gauge 11 is attached to a spindle housing 2A so as to be opposed to the upper end of a spindle 1A.

The operation of the boring machine having a boring unit of this construction is identical with that of the boring machine of FIG. 4, and the former boring machine has the same effect as the latter boring machine.

FIG. 8 shows a boring unit provided with a high-frequency-driven type spindle 1B, and a rotor 10 supported on a ball bearing 16, to which boring unit the techniques according to the present invention is applied. In this boring unit, a non-contacting micro-displacement gauge 11 is attached to a spindle housing 2B so as to be opposed to the upper end of the spindle 1B.

The operation of the boring machine having a boring unit of this construction is also identical with that of the boring machine of FIG. 4, and the former boring machine has the same effect as the latter boring machine.

Figure 9:
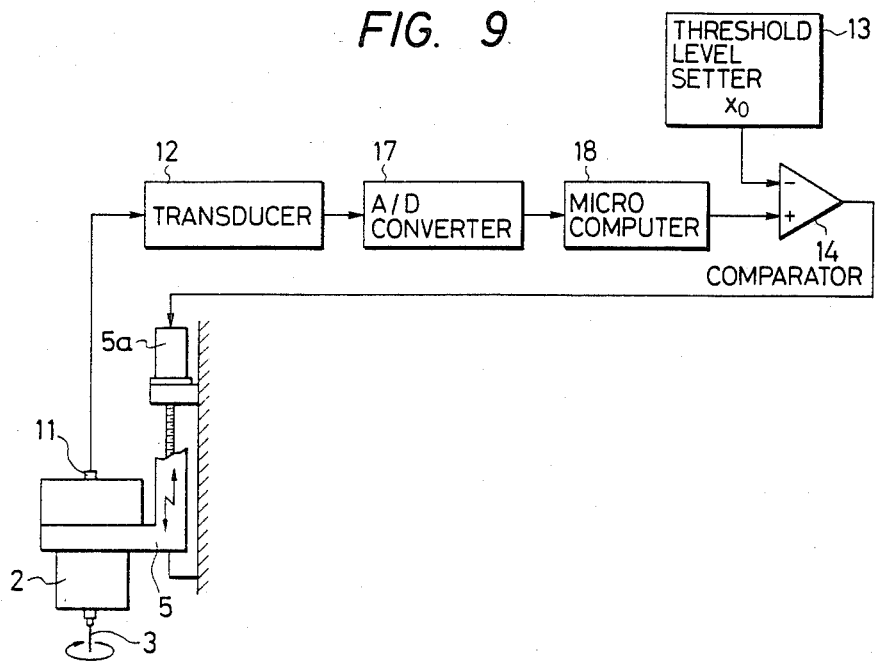
FIG. 9 is a schematic diagram of another embodiment of the boring machine according to the present invention.

FIG. 9 is a schematic diagram of a further embodiment of the boring machine according to the present invention. The parts of the boring machine of FIG. 9 which have the same reference numerals as in FIG. 4 are identical with those of the boring machine of FIG. 4. Reference numerals 17, 18 denote an A/D converter and a microcomputer, respectively. The A/D converter 17 and microcomputer 18 form an output signal zero compensator, which is provided between a transducer 12 and a comparator 14.

The functions of the output signal zero compensator will now be described with reference to FIGS. 10 and 11.

Figure 10:
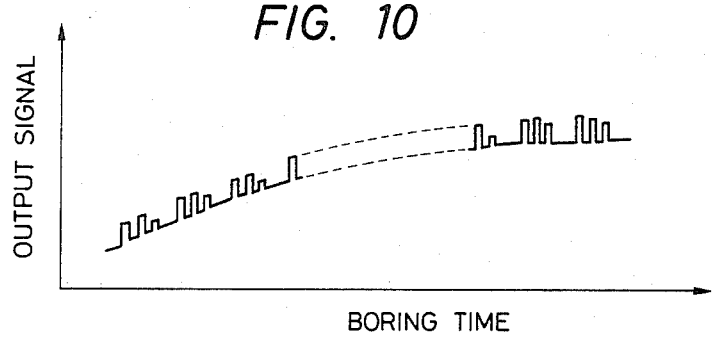
FIG. 10 is a graph showing the relation between and example of an output signal generated when the spindle is thermally influenced, and the boring time.

FIG. 10 is a graph showing the relation between an example of an output signal generated when the spindle is thermally influenced, and the boring time. In this graph, a portion of an output signal in the form of a pulse obtained from the A/D converter, and a drift portion increasing with the lapse of the boring time are superposed on each other.

Figure 11:
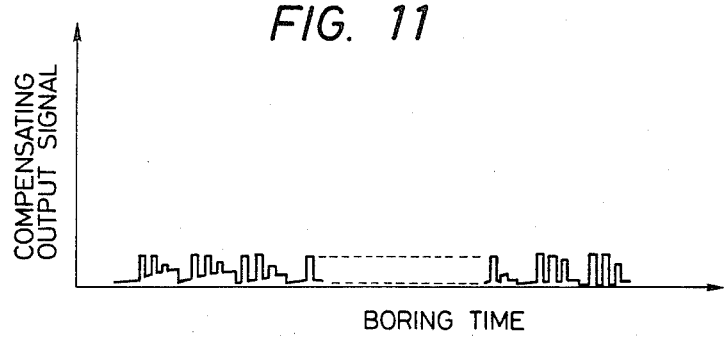
FIG. 11 is a graph showing the relation between a compensated output signal obtained by an output signal zero compensator and the boring time.

FIG. 11 is a graph showing the relation between a compensated output signal obtained by the compensator so as to reduce the drift portion, and the boring time.

In the embodiment of FIG. 4, thermal expansion of the spindle occurs in some cases due to the heat (from the rotor 10 in the embodiment of FIG. 8) generated by the shearing resistance of the air bearing 8a. In such cases, the output signal from the displacement gauge 11 drifts as boring time increases as shown in FIG. 10, and, if this drift is allowed to continue, the output signal does not represent the actual thrust force. In order to prevent this error, the compensator is provided.

In the embodiment thus constructed, the output signal from the non-contacting micro-displacement gauge 11 is converted into thrust force by a transducer 12, and the thrust force is digitized by the A/D converter 17. The digitized thrust force is compensated by a microcomputer 18 at intervals of a predetermined number (one to several) of boring operations so that the level of an output generated when a boring operation is not carried out (i.e. when a drill 3 is not in contact with a workpiece 6) is read as zero. Consequently, a compensated output signal in which the drift is removed as shown in FIG. 11 is obtained, and this signal is input into a comparator 14.

Even if the thermal expansion of the spindle 1 occurs in the embodiment described above of FIG. 9, the influence thereof can be eliminated, and the thrust force can be detected accurately by the non-contacting micro-displacement gauge 11.

Figure 12:
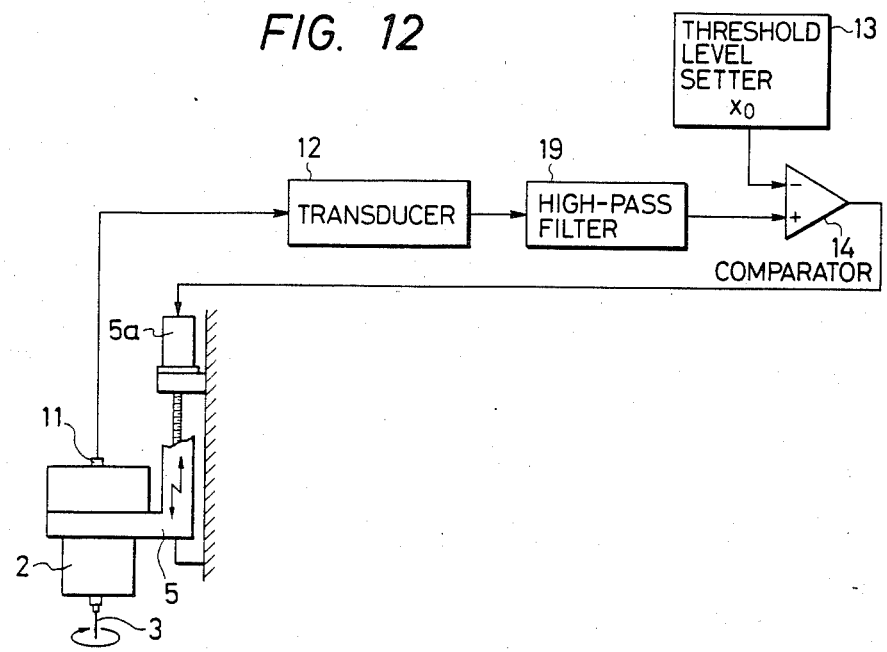
FIG. 12 is a schematic diagram of still another embodiment of the boring machine according to the present invention.

FIG. 12 is a schematic diagram of a further embodiment of the boring machine according to the present invention. In FIG. 12, the parts having the same reference numerals as in FIG. 9 are identical with those of the same reference numbers shown in FIG. 9. Reference numeral 19 denotes a high-pass filter constituting an output signal zero compensator and provided between a transducer 12 and a comparator 14.

The boring machine thus constructed is also operated in the same manner as the embodiment of FIG. 9, and the drift portion, which consists of a low-frequency component, such as a DC component, and which occurs due to the thermal expansion of the spindle 1, of an output signal is removed by the high-pass filter. Accordingly, the thrust force can be detected accurately by the non-contacting micro-displacement gauge 11.

In each of the above embodiments, the non-contacting micro-displacement gauge 11 is attached to the spindle housing but it is not strictly necessary that the gauge 11 be attached to the mentioned part; the gauge 11 may be attached to a part which is formed substantially integrally with the spindle housing, for example, the spindle feed mechanism 5.

Figure 13:
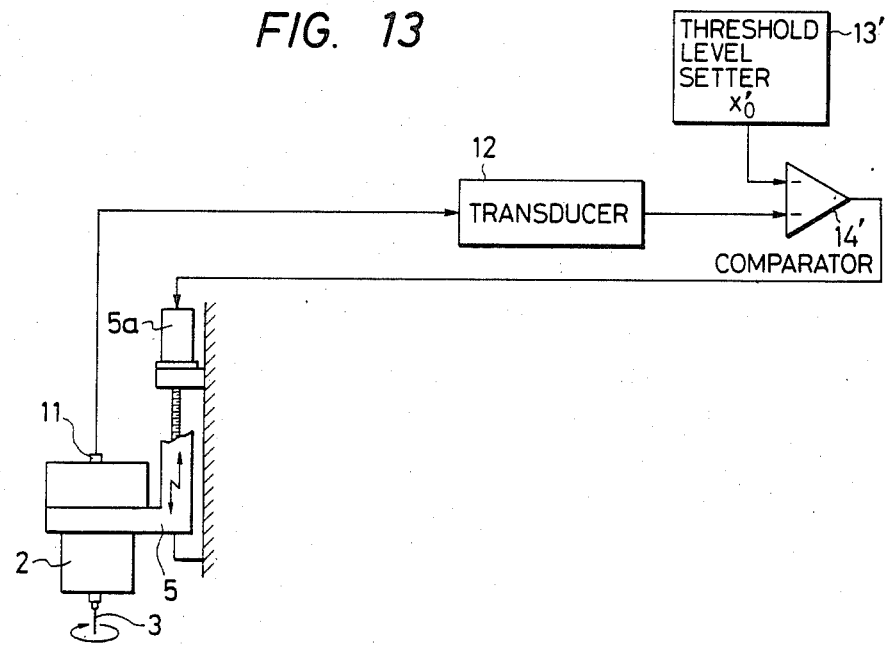
FIG. 13 is a schematic diagram of still another embodiment of the boring machine of the type shown in FIG. 4.

In each of the above embodiments, a displacement signal from the non-contacting micro-displacement gauge 11 is converted into a thrust force signal. Since there is a substantially proportional relation between the axial displacement of the spindle and the thrust force applied thereto as shown in FIG. 3, it is possible to control the spindle by utilizing the variations in this axial displacement itself instead of the thrust force. Therefore, in a boring machine (shown in FIG. 13) which consists of the same boring machine as shown in FIG. 4, with the transducer 12 omitted, a threshold level $y_O$ of axial displacement may be set in a setter 13' to compare this threshold level with the level of the axial displacement signal by a comparator 14'.

In the embodiment of FIGS. 9 and 10, the comparator is provided between the transducer 12 and comparator 14. It may also be provided between the non-contacting micro-displacement gauge 11 and transducer 12.

In the present invention described in detail above, a boring machine of a comparatively simple construction can be provided, in which boring by a spindle, rotating at high speed, can be precisely controlled by detecting the axial displacement or thrust force applied to the spindle in boring, in contrast to the conventional boring machine in which the drill is controlled by detecting the rotary torque thereof. Therefore, the boring machine of the present invention enables a minute, deep bore of a high quality to be made without breaking the drill, and has an excellent effect.

What is claimed is:

1. A boring machine capable of detecting and controlling thrust force to obtain a high quality bore having a drill, a spindle housing, a spindle holding said drill and supported rotatably in said spindle housing, a driving means for rotating said spindle, a spindle transfer mechanism provided with a transfer means supporting said spindle housing so that said spindle housing can be transferred, and a non-contacting displacement gauge means for detecting the axial displacement of said spindle in rotary motion relative to the spindle housing to provide a proportional measurement of thrust force in the spindle, a means for setting a threshold level of the axial displacement, a means for comparing the axial displacement of the spindle relative to the spindle housing obtained by said gauge means with said threshold level of the axial displacement, and a control means for carrying out a feedback operation when the level of said actual axial displacement is higher than said threshold level to maintain the thrust force in the spindle at a predetermined level.

2. A boring machine according to claim 1, wherein said machine includes an output signal zero compensator consisting of an A/D converter and a microcomputer, and said compensator is provided between said gauge means and said comparing means.

3. A boring machine according to claim 1, wherein said machine includes an output signal zero compensator consisting of a high-pass filter and provided between said gauge means and said comparing means.

4. A boring machine according to claim 1, wherein said machine includes a converter means for determining the thrust force applied to said spindle, on the basis of the axial displacement thereof, a means for setting a threshold level of said thrust force, a means for comparing the level of the actual thrust force with said threshold level, and a control means for carring out a back feed operation when the level of said actual thrust force is higher than said threshold level.

5. A boring machine according to claim 4, wherein said machine includes an output signal zero compensator for reducing the drift of an output signal obtained by said gauge means, and said compensator is provided between said gauge means and said comparing means.

6. A boring machine according to claim 4, wherein said machine includes an output signal zero compensator consisting of an A/D converter and a microcomputer, and said compensator is provided between said gauge means and said comparing means.

7. A boring machine according to claim 6, wherein said machine includes an output signal zero compensator consisting of a high-pass filter and provides between said gauge means and said comparing means.

8. A boring machine according to claim 1, wherein said driving means is provided for rotating the drill at a speed on the order of about 60,000 to 80,000 r.p.m.

9. A boring machine according to claim 1, wherein the non-contacting displacement gauge means in mounted on the spindle housing in operative proximity to said spindle.

10. A boring machine according to claim 9, wherein said driving means is provided for rotating the drill at a speed on the order of about 60,000 to 80,000 r.p.m.

11. A boring machine according to claim 1, wherein the non-contacting displacement gauge means is mounted on the machine in operative proximity to said spindle to detect the axial displacement of said spindle on rotary motion.

12. A boring machine according to claim 11, wherein said driving means is provided for rotating the drill at a speed on the order of about 60,000 to 80,000 r.p.m.

13. A boring machine according to claim 1, wherein said machine includes an output signal zero compensator for reducing the drift of an output signal obtained by said gauge means, and said compensator is provided between said gauge means and said comparing means.

* * * * *